(12) United States Patent
Liu et al.

(10) Patent No.: US 8,071,458 B1
(45) Date of Patent: Dec. 6, 2011

(54) METHOD FOR FORMING AN INTERFACIAL PASSIVATION LAYER ON THE GE SEMICONDUCTOR

(75) Inventors: Po-Tsun Liu, Hsinchu (TW); Chen-Shuo Huang, Kaohsiung County (TW); Yi-Ling Huang, Taipei County (TW); Szu-Lin Cheng, Kaohsiung (TW); Simon M. Sze, Hsinchu (TW); Yoshio Nishi, Stanford, CA (US)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 12/953,601

(22) Filed: Nov. 24, 2010

(30) Foreign Application Priority Data

Aug. 19, 2010 (TW) .............................. 99127661 A

(51) Int. Cl.
*H01L 21/02* (2006.01)
(52) U.S. Cl. ................................ 438/393; 257/E21.008

(58) Field of Classification Search ........... 257/E21.008; 361/301.4, 313; 438/4, 393, 591, 778
See application file for complete search history.

(56) References Cited

OTHER PUBLICATIONS

Liu, P. et al. (Mar. 17, 2010). Effects of postgate dielectric treatment on germanium-based metal-oxide-semiconductor device by supercritical fluid technology. Applied Physics Letters, 96, 112902.*
Liu et al, Po-Tsun; Effects of Postgate Dielectric Treatment on Germanium-Based Metal-Oxide-Semiconductor Device by Supercritical Fluid Technology; Applied Physics Letters 96, 112902-1-112902-3, American Institute of Physics 2010.

\* cited by examiner

*Primary Examiner* — N Drew Richards
*Assistant Examiner* — Daniel Shook
(74) *Attorney, Agent, or Firm* — Bacon & Thomas, PLLC

(57) ABSTRACT

The invention discloses a method for forming an interfacial passivation layer on the Ge semiconductor. The supercritical $CO_2$ fluids is used to form an interfacial passivation layer between Ge channel and gate insulator layer, and improve the dielectric characteristics of gate insulator after high-temperature thermal annealing process.

9 Claims, 11 Drawing Sheets

METHOD FOR FORMING AN INTERFACIAL PASSIVATION LAYER ON THE GE SEMICONDUCTOR

BACKGROUND OF THE INVENTION

1. Field of the Invention

The invention relates to a method for forming a protection layer on the semiconductor, particularly to a method for forming an interfacial passivation layer on the germanium semiconductor.

2. Description of the Prior Art

At present, the development trend for the manufacturing technology of the integrated circuit (IC) is still kept to the trend of miniaturizing transistor size, in order to reach the goal of high efficacy and high density. Due to the efficacy of conventional polycrystalline silicon/silicon dioxide/silicon channel metal-oxide-semiconductor field effect transistor is unable to be increased by the miniaturizing technology, thus, how to increase the mobility of carrier and the dielectric capacitance of gate has become the key technology and goal for the development of field effect transistor in the next generation. Wherein, the mobility for the electron and hole of Ge semiconductor is 2 times and 4 times higher than those of silicon, respectively. The basic process is similar to the silicon semiconductor technology. Thus, the germanium metal-oxide-semiconductor field-effect transistor (Ge-MOSFET) has been considered as the most promising candidate for the next generation of semiconductor industry.

In the past development process of Ge-MOSFET, various different gate insulators had been tried, such as the germanium dioxide ($GeO_2$), silicon dioxide ($SiO_2$), or the material with high dielectric constant (high-k), such as hafnium dioxide ($HfO_2$), aluminum dioxide ($Al_2O_3$), in order to improve the capacitor coupling ability of gate insulator layer. However, large density of state contained between the high-k dielectric and germanium channel, and diffusion of germanium in high-k dielectric during inevitable thermal process, result in threshold voltage shift and gate leakage current increasing.

According to prior art, introduce a thin high-quality protection layer between high-k dielectric film and germanium semiconductor is able to prevent the generation of defect on germanium interface, wherein the germanium dioxide has the best efficacy.

In the US Patent No. 2006/0099872 of "Method for forming an interface between germanium and other materials", the sulfide, such as $H_2S$ or $SF_6$ is used to form an interface on semiconductor surface. The process is still a conventional method, and the interface has to be formed before gate insulator layer deposition. Thus, the interface is unable to be formed after the gate insulator deposition, and the defect generation in gate insulator could occur again during sequent thermal process.

In the US Patent No. 2006/0292872A1 of "Atomic layer deposition of thin films on Germanium", before the method of atomic layer deposition is used to grow gate insulator layer with high dielectric constant, the germanium oxynitride is formed at the interface. The process temperature could be too high, and the interface is unable to be formed after the gate insulator deposition, and the defects could generate in gate insulator during sequent thermal process In the US Patent No. 2007/0099398A1 of "Method and system for forming A nitride Germanium-containing layer using plasma processing", the plasma method is used to form the germanium nitride, the germanium dioxide or the nitride germanium oxide as the interface. Although it is a low-temperature process, it requires the vacuum system, only the interface is able to be formed. The interface is unable to be formed after the gate insulator deposition, and the defects could generate in gate insulator during sequent thermal process.

In current Ge-MOSFET manufacture process, it is inevitable to use the high-temperature process (such as dopant activation after the ion implantation or the annealing process after the metal sputtering). It will always cause the significant thermal diffusion of germanium and the surface damage of germanium. The poor thermal stability of germanium oxide cause chemical reaction of germanium oxide and germanium substrate. Sequent thermal decomposition of germanium oxide results poor interface between gate dielectric and germanium substrate, and thermal diffusion of germanium in gate dielectric. Thus, how to develop a low-temperature process to form a high-quality protection layer between germanium substrate and gate dielectric layer to prevent the generation of defect has become an important gate engineering technology.

Therefore, in order to produce more efficient germanium semiconductor surface protection layer technology, provide the industry to grasp better production process, and apply it on the manufacturing of Ge-MOSFET, it is necessary to research and develop the innovative method for forming an interfacial passivation layer on the germanium semiconductor, to improve the production efficiency for the interfacial passivation layer on the germanium semiconductor and reduce the manufacturing cost of the semiconductor.

SUMMARY OF THE INVENTION

The invention relates to a method for forming an interfacial passivation layer in the Ge semiconductor. It is able to form a high-quality interfacial layer made by low-temperature process between the Ge semiconductor and gate dielectric layer. Thus, it is able to be used in the advanced semiconductor technology.

The invention can be applied for the pre-treatment of Ge surface before the formation of gate dielectric layer. It also can be applied after the formation of gate dielectric layer or after the high-temperature thermal annealing process. The quality of gate insulator layer can be improved, and flat and high-quality Ge/gate interfacial passivation layer can be formed in order to simplify the semiconductor process.

The supercritical fluid technology of the invention can be applied to mend the degraded dielectric characteristics after the thermal annealing process, so that the gate-first process can be applied to the Ge transistor process.

When the technology of the invention is applied to the gate insulator layer with high dielectric constant, the Ge-MOSFET may have high gate capacitance, and have more smooth interfacial protection layer and better carrier mobility, in order to form a high efficient Ge-MOSFET component with high on-current.

The invention can rebuild the interface destroyed by a series of high-temperature thermal process (such as higher than 400° C.) via low-temperature of supercritical fluid process, and passivate the electric defect caused by the Ge diffused into the insulator layer.

The invention can add the oxidant or reducing agent into supercritical carbon dioxide fluid, it can penetrate through the gate insulator layer and form the protection chemical compound layer on the surface of Ge semiconductor at low temperature (such as below 200° C.).

The invention employs low-temperature (about 150° C.) supercritical fluid technology to passivate the defect of gate insulator layer, and avoid the use of conventional high-temperature process (greater than 400° C.), in order to reduce the thermal budget and inhibit the Ge diffusion effect.

In the Ge semiconductor of the invention, the hafnium dioxide ($HfO_2$) deposited by the electronic gun can be used as the gate dielectric layer of Ge-MOSFET. The chemical bond is strengthened after the treatment, which proves that the gate insulator layer can be penetrated by the low-temperature supercritical fluid treatment technology. Thus the invention can be applied in Ge-MOSFET field with high-k dielectric gate insulator layer.

Due to the invention can form an interfacial passivation layer with good quality under low-temperature process of 150° C., thus the development of technology has great innovation and advancement.

Therefore, the advantage and spirit of the invention can be understood further by the following detail description of invention and attached Figures.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
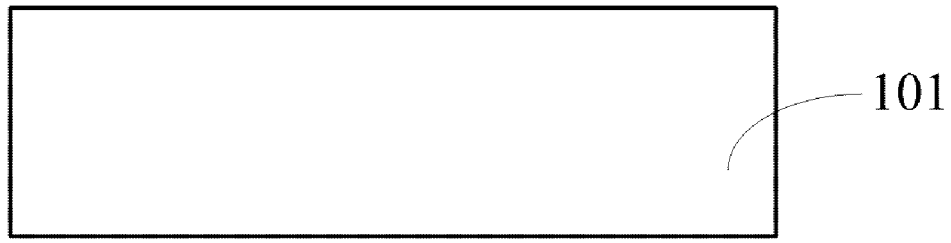
FIG. 1A to FIG. 1D show the first embodiment for a method for forming an interfacial passivation layer on the Ge semiconductor of the invention.

The invention relates to a method for forming an interfacial passivation layer on the germanium (Ge) semiconductor. The detail of FIG. 1A to FIG. 1D in the first embodiment is described as follows:

As shown in FIG. 1A, firstly, the general epitaxy technology (such as Molecular Beam Epitaxy process, Metal-Organic Chemical Vapor Deposition process) is employed to deposit a Ge semiconductor layer 101 (about 2.5 μm thick).

Figure 1B:
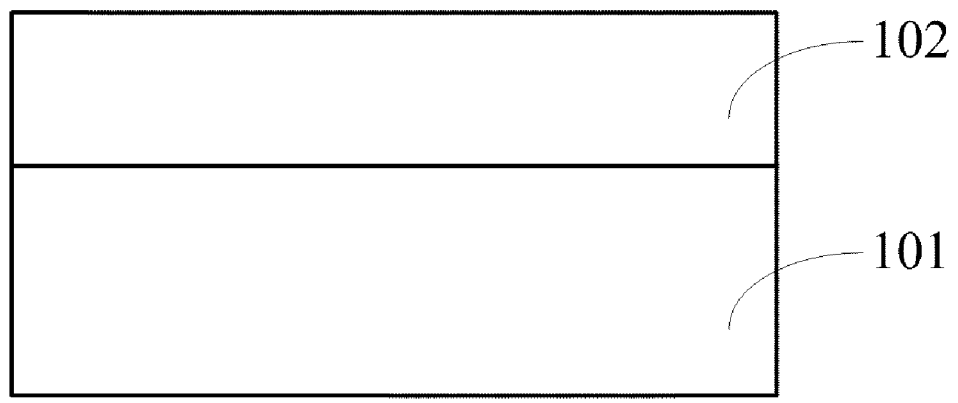

As shown in FIG. 1B, the Low Pressure Chemical Vapor Deposition System (LPCVD) is employed to deposit a silicon dioxide ($SiO_2$) layer 102 (about 12 nm thick) on the Ge semiconductor layer 101 (including P-type Ge semiconductor layer or N-type Ge semiconductor layer), which is used as the gate insulator layer.

Figure 1C:
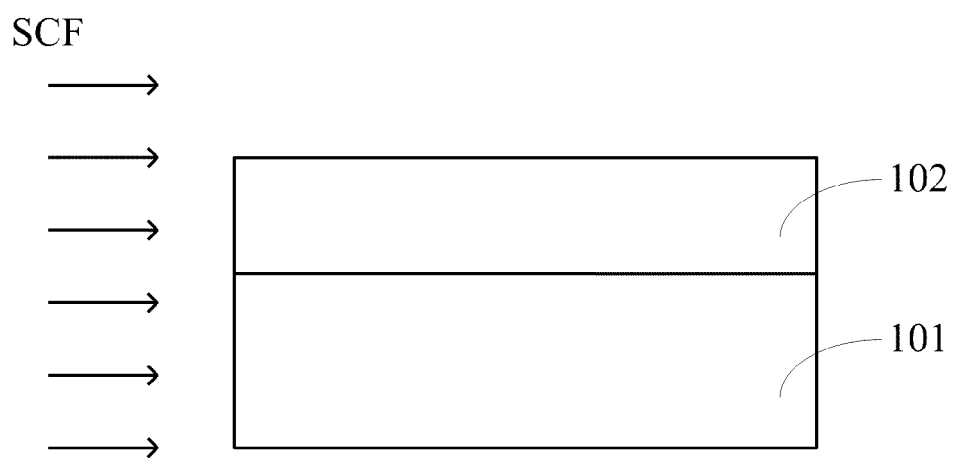

As shown in FIG. 1C, mix the carbon dioxide gas, 1~10 vol % water oxidant, and propyl alcohol at 100° C. to 200° C. and 1000 psi to 3500 psi to form the low-temperature supercritical fluid (SF). Carry the supercritical fluid into the interface between the silicon dioxide layer (insulator layer) 102 and the Ge semiconductor layer 101 for the reaction, in order to form a good germanium dioxide interfacial passivation layer.

Figure 1D:
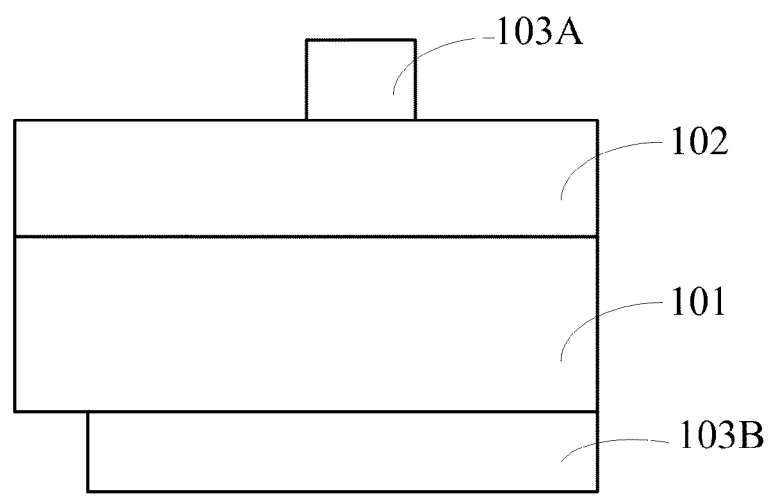

Finally, as shown in FIG. 1D, the thermal evaporation process is employed to form an aluminum film 103A on the silicon dioxide layer (insulator layer) 102, which is used as the electrode 103A above the aluminum film of MOS Capacitor. The thermal evaporation process is employed to form an aluminum film 103B below the Ge semiconductor layer 101, which is used as the electrode 103B below the aluminum film of MOS Capacitor.

Figure 2A:
FIG. 2A to FIG. 2E show the second embodiment for a method for forming an interfacial passivation layer on the Ge semiconductor after thermal annealing of the invention.

The invention relates to a method for forming an interfacial passivation layer on the Ge semiconductor after thermal annealing. The detail of FIG. 2A to FIG. 2E in the second embodiment is described as follows:

As shown in FIG. 2A, firstly, the general epitaxy technology (such as Molecular Beam Epitaxy process, Metal-Organic Chemical Vapor Deposition process) is employed to deposit a Ge semiconductor layer 201 (about 2.5 u, thick).

Figure 2B:
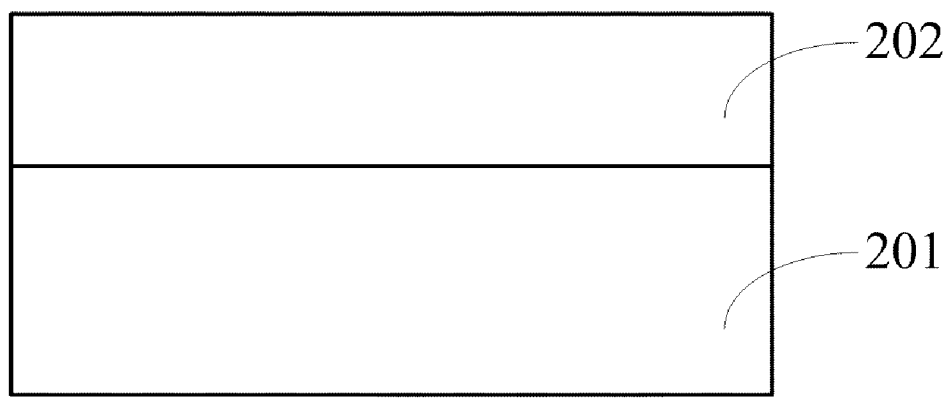

As shown in FIG. 2B, the Low Pressure Chemical Vapor Deposition System (LPCVD) is employed to deposit a silicon dioxide ($SiO_2$) layer 202 (about 12 nm thick) on the Ge semiconductor layer 201 (including P-type Ge semiconductor layer or N-type Ge semiconductor layer), which is used as the gate insulator layer.

Figure 2C:
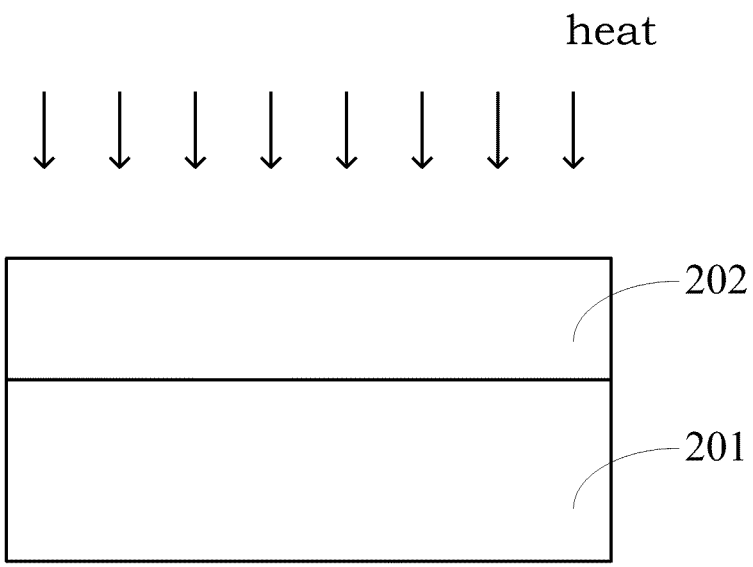

As shown in FIG. 2C, the annealing treatment is performed for the silicon dioxide layer (insulator layer) 202 and the Ge semiconductor layer 201 at about 400° C.

Figure 2D:
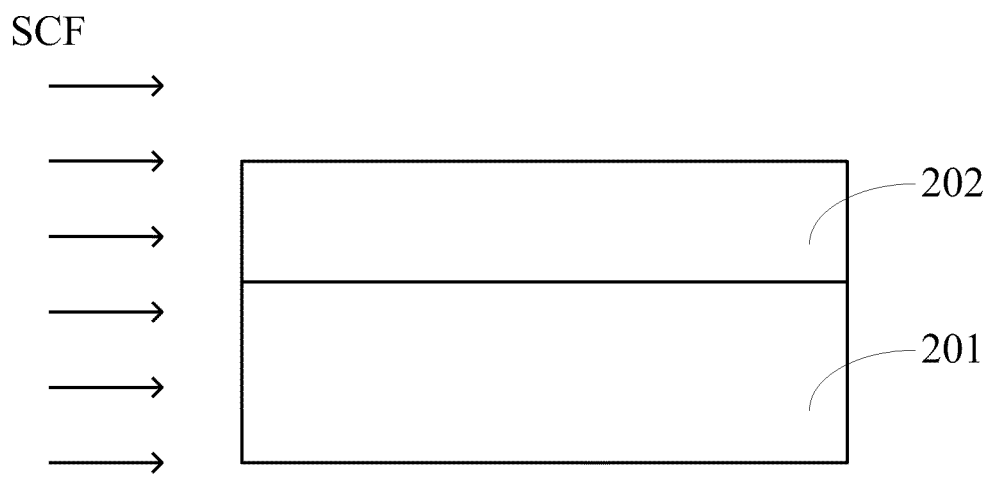

As shown in FIG. 2D, mix the carbon dioxide gas, 1~10 vol % water oxidant, and propyl alcohol at 100° C. to 200° C. and 1000 psi to 3500 psi to form the low-temperature supercritical fluid (SF). Carry the supercritical fluid into the interface between the silicon dioxide layer (insulator layer) 202 and the Ge semiconductor layer 201 for the reaction, in order to form a good germanium dioxide interfacial passivation layer and passivate the thermal diffused impurity (germanium-related impurity).

Figure 2E:
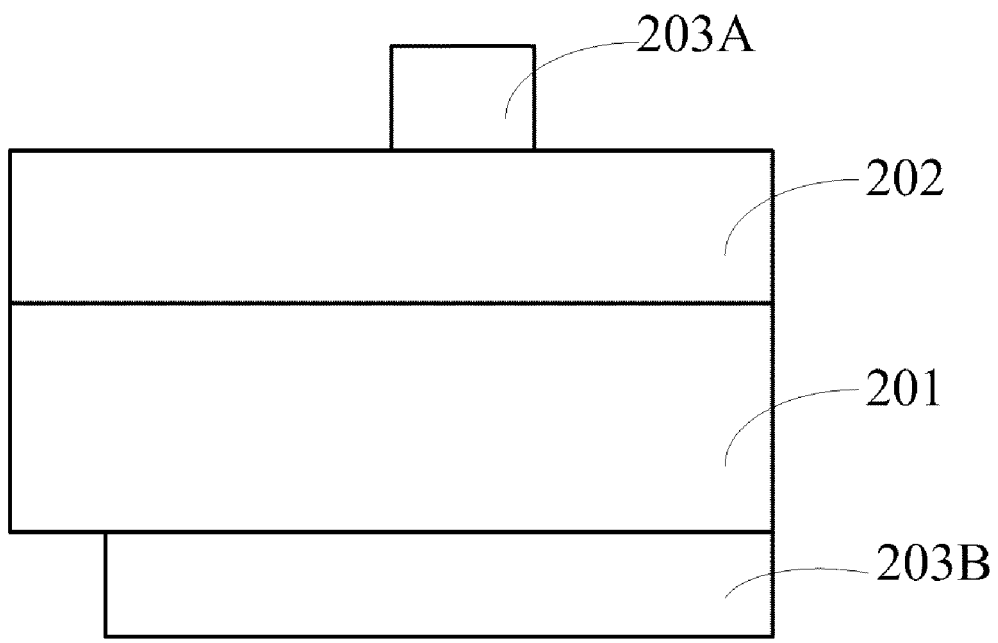

Finally, as shown in FIG. 2E, the thermal evaporation process is employed to form an aluminum film 203A on the silicon dioxide layer (insulator layer) 202, which is used as the upper electrode 203A above the aluminum film of MOS Capacitor. The thermal evaporation process is employed to form an aluminum film 203B below the Ge semiconductor layer 201, which is used as the bottom electrode 203B below the aluminum film of MOS Capacitor.

In the above-mentioned first embodiment and second embodiment, the electronic gun also can be used to deposit a hafnium dioxide ($HfO_2$) insulator layer (13 nm thick), which can be used to substitute the silicon dioxide layer (insulator layer) 202 as the gate dielectric layer. Actually, the insulator layer used in the invention includes the metal oxide, silicon oxide, and germanium oxide.

The physical properties of supercritical fluid are similar to liquid and gas. Thus, the supercritical fluid has high diffusion coefficient and low surface tension, which can penetrate into nano-structure effectively, and prevent the damage of nano-structure. In addition, the supercritical fluid has high dissolving ability and high transmitting ability, which can carry the oxidant ($H_2O$ in the invention) deeply to the interface between the insulator and germanium substrate for the reaction effectively, in order to form a good interfacial passivation layer.

Figure 3A:
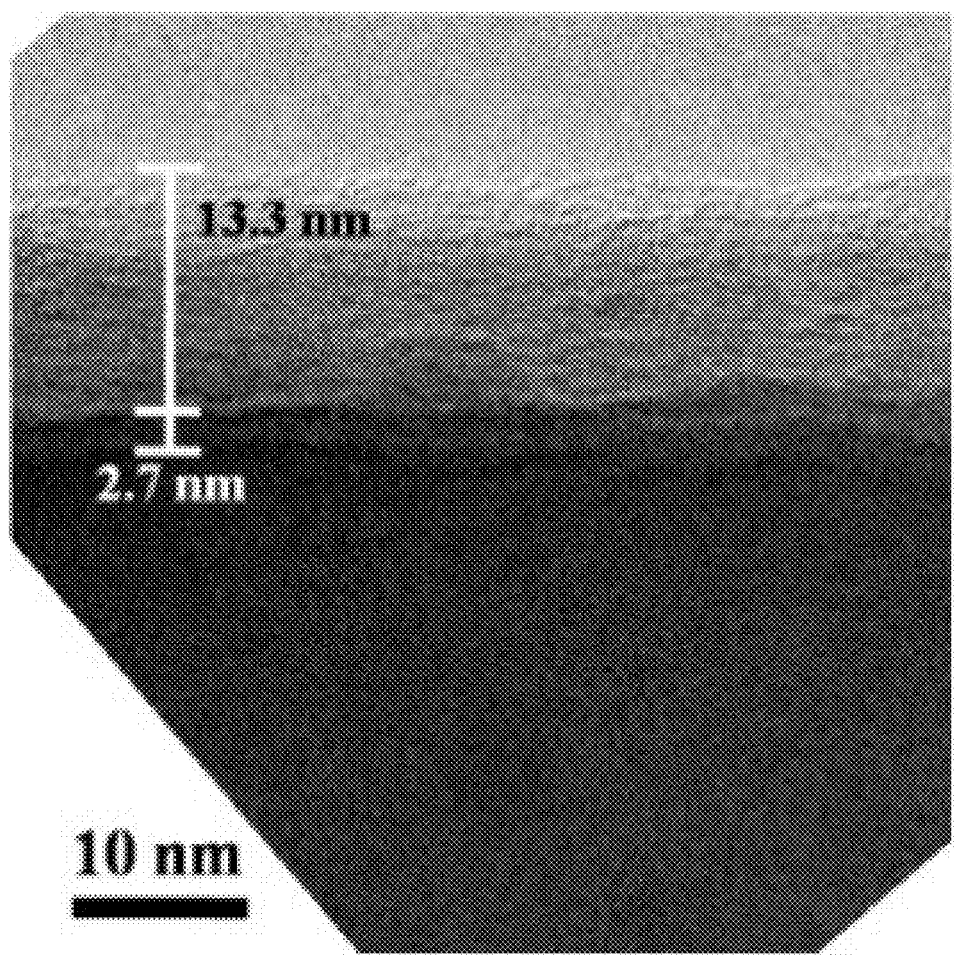
FIG. 3A shows the transmission electron microscope image of $SiO_2$/Ge interface before the supercritical fluid treatment.
Figure 3B:
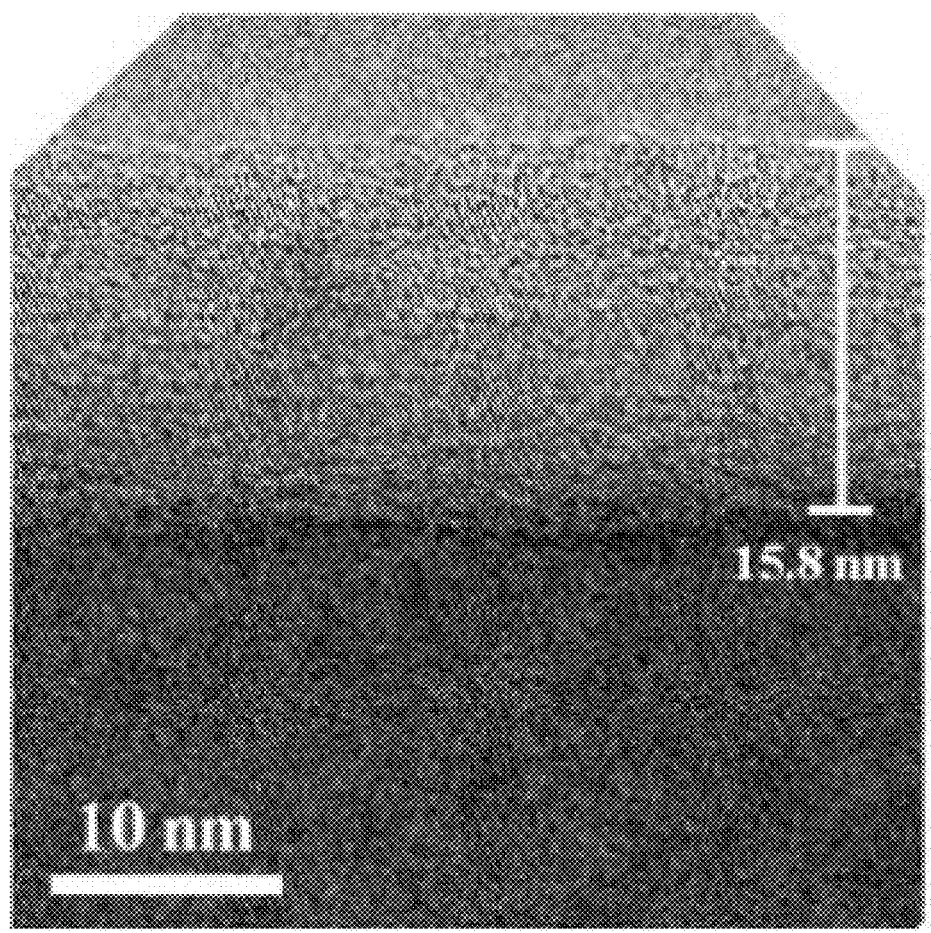
FIG. 3B shows the transmission electron microscope image of $SiO_2$/Ge interface after the supercritical fluid treatment.

As shown in FIG. 3A, the transmission electron microscope (TEM) image of $SiO_2$/Ge interface before the supercritical fluid treatment is illustrated. As shown in FIG. 3B, the transmission electron microscope (TEM) image of $SiO_2$/Ge interface after the supercritical fluid treatment is illustrated. Compare these two figures, it is found that the Ge surface after the supercritical fluid treatment has much clearer and more smooth interfacial layer.

Figure 4A:
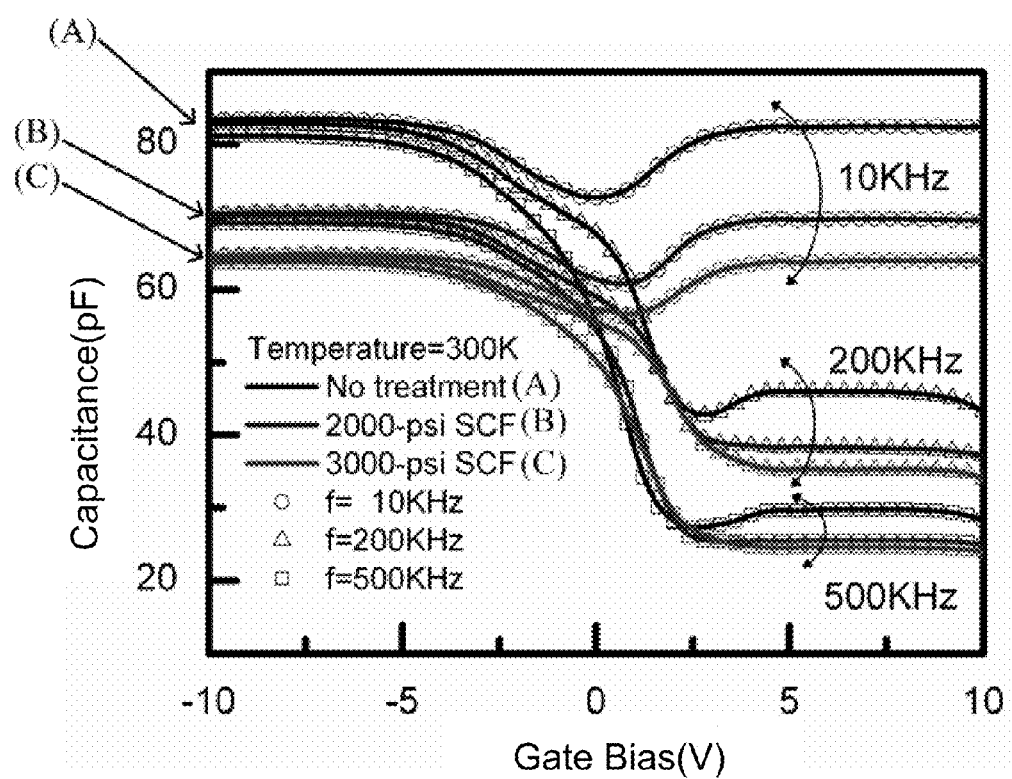
FIG. 4A and FIG. 4B show the capacitance-voltage relation diagram after the supercritical fluid treatment under different frequency and temperature.
Figure 4B:
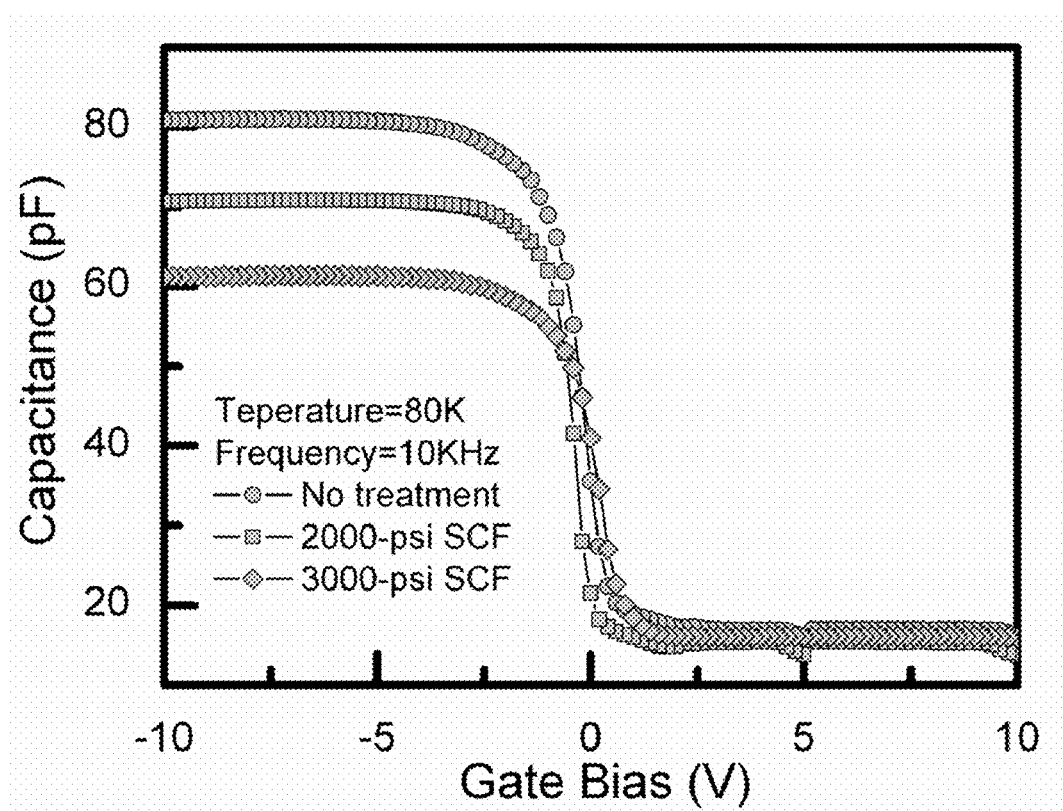

As shown in FIG. 4A and FIG. 4B, the capacitance-voltage relation diagram after the supercritical fluid treatment is illustrated under different frequency and temperature. As shown in FIG. 4A, the capacitance in inversion area (positive bias area) is decreased with the increase of frequency. However, at low frequency (such as 10 KHz), the inversion capacitance is generated from a minor carriers via the surface defect of Ge semiconductor through the thermal excitation. When the frequency is increased, the generation of carriers is unable to catch up with the frequency response, so that the inversion capacitance is decreased gradually. As shown in FIG. 4B, when the temperature is reduced to 80K, there is no significant difference for the inversion capacitance no matter the supercritical fluid treatment is performed or not. It is also verified that the inversion capacitance is generated from a minor carriers via the surface defect of Ge semiconductor through the thermal excitation. When the temperature is decreased, the carriers are unable to be generated due to the energy loss. Thus, even the frequency is as low as 10 KHz, the inversion capacitance is also unable to be appeared. Summarize the result of FIG. 4A and FIG. 4B, the inversion capacitance of component is reduced after the supercritical fluid treatment at room temperature, and the speed of component is faster than the component without treatment. It is known that after the supercritical fluid treatment, the surface defect of component is reduced, and the generation of high-frequency inversion capacitance is inhibited.

Figure 5:
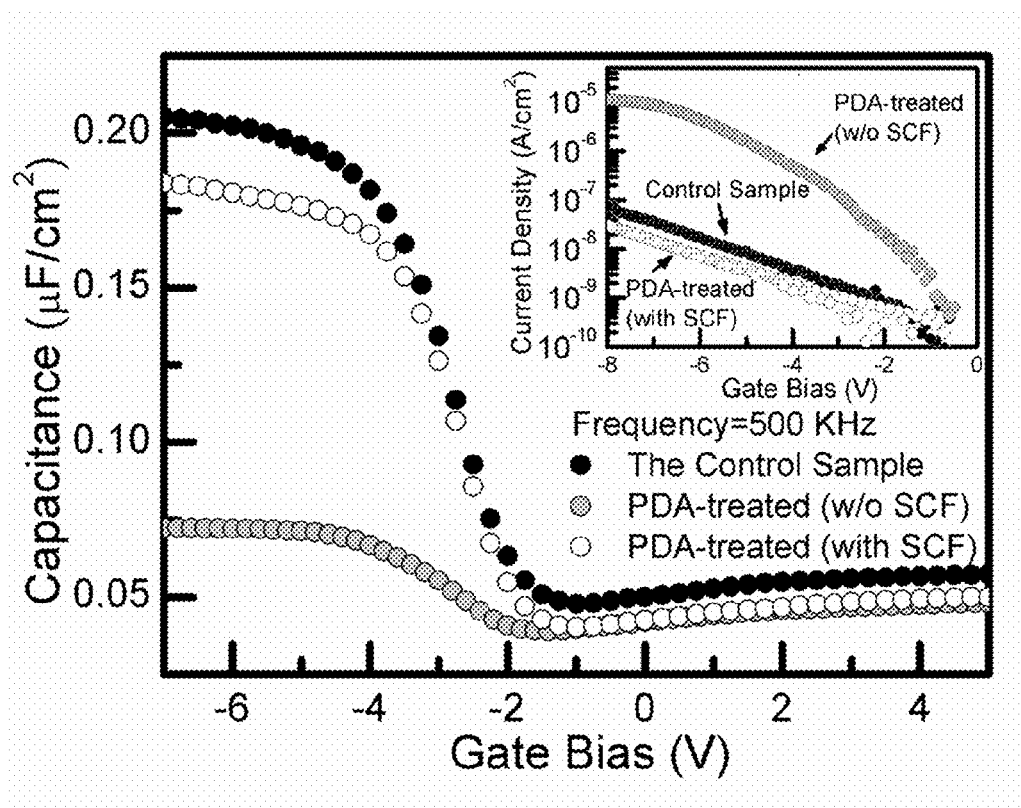
FIG. 5 shows the "capacitance-voltage characteristic diagram". The insert is the corresponding characteristic of gate leakage current density with and without SCF treatment after post dielectric annealing.

As shown in FIG. 5 of the "capacitance-voltage characteristic diagram", the accumulation capacitance after thermal annealing treatment (negative bias area) is lowest. It shows the annealing treatment will degrade the interface between the Ge and insulator layer. After thermal annealing treatment and supercritical fluid treatment, the accumulated capacitance will recover to nearly initial capacitance value. It shows that the supercritical fluid treatment can mend the degradation of interfacial layer on Ge semiconductor, and rebuild good interfacial layer between the Ge and insulator layer. In addition, in the "gate leakage current diagram" at upper right area, it is found that high-temperature thermal annealing process will increase the leakage current of Ge-MOSFET. After the supercritical fluid treatment, the gate leakage current will be reduced significantly, even reduced to nearly the original value. Summarize the result of the "capacitance-voltage characteristic diagram" and the "gate leakage current diagram", it is shown that high-temperature thermal annealing process will destroy the interface between the Ge and insulator layer, and may cause the thermal diffusion of Ge into the insulator layer to form new leakage current route. After the supercritical fluid treatment, it is able to rebuild good Ge interfacial layer effectively, and passivate the defect formed by Ge diffusion. Thus, it is able to reduce the gate leakage current.

Figure 6:
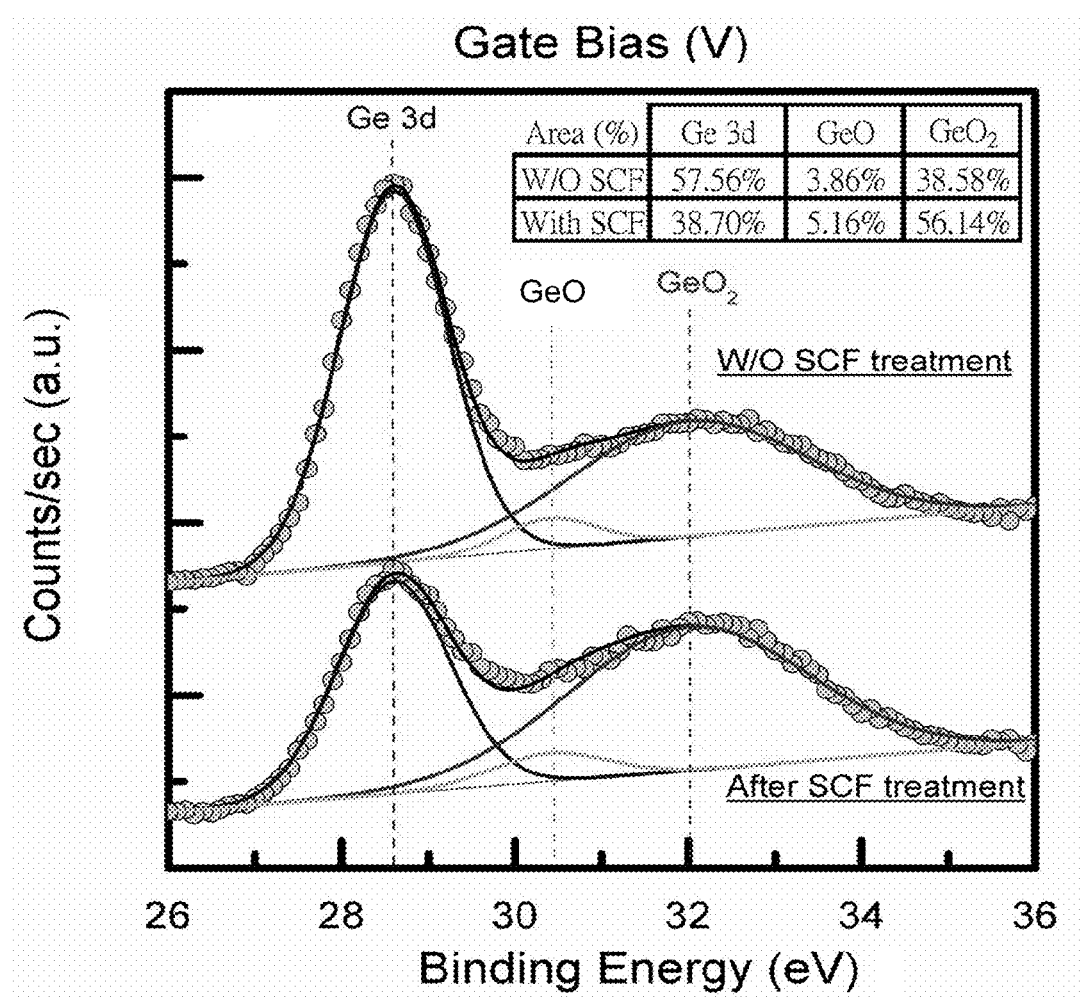
FIG. 6 shows the bond analysis diagram of x-ray photoelectron spectroscopy for hafnium oxide MOSFET with and without SCF treatment.

FIG. 6 shows the bond analysis diagram of x-ray photoelectron spectroscopy for hafnium oxide MOSFET. It is found from FIG. 6 that after the supercritical fluid treatment, Ge 3d (represent the bond among germanium element) is decreased by 18.86%, but $GeO_2$ (germanium oxide interfacial layer with less interfacial layer state defect intensity) is increase by 17.56%. It shows after the supercritical fluid treatment, the germanium element on the interface can be oxidized effectively, and high-quality germanium dioxide interfacial passivation layer can be formed. It also shows the supercritical fluid treatment is able to penetrate the deposited dielectric layer, and use the oxidant or nitride agent carried by the fluid molecule to react on the interface.

The invention relates to a manufacturing process of Ge-MOSFET. The Ge semiconductor and LPCVD $SiO_2$ are employed in the MOS capacitor as gate dielectric insulator layer. Before or after the formation of the gate dielectric insulator layer, or with post-dielectric thermal annealing, the low-temperature supercritical fluid (SF) treatment technology can increase the quality of component interface, and mend the gate leakage current after high-temperature thermal annealing process. The good interfacial layer formed in the invention is able to reduce the interfacial defect between the gate insulator layer and Ge semiconductor. Thus, the low-temperature supercritical fluid is able to form high-quality interfacial layer between the Ge semiconductor and gate insulator layer, and is able to improve the quality of gate insulator layer degraded by the thermal annealing process.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for forming an interfacial passivation layer on a germanium semiconductor, comprising:
    using an epitaxy technology to deposit a germanium semiconductor layer;
    using a low pressure chemical vapor deposition system to deposit a gate insulator layer on the germanium semiconductor layer; and
    mixing a carbon dioxide gas, a water, and a propyl alcohol to form as a supercritical fluid and carrying the supercritical fluid into an interface between the gate insulator layer and the germanium semiconductor layer in order to form an interfacial passivation layer;
    using a thermal evaporation process to form an first aluminum film on the gate insulator layer and using the thermal evaporation process to form a second aluminum film below the germanium semiconductor layer.

2. The method according to claim 1, wherein the thickness of germanium semiconductor comprises about 2.5 μm.

3. The method according to claim 1, wherein the insulator layer is selected from the group consisting of metal oxide, silicon oxide and germanium oxide.

4. The method according to claim 1, wherein the interfacial layer comprises germanium dioxide interfacial passivation layer.

5. A method for forming an interfacial passivation layer on the germanium semiconductor, comprising:
    using an epitaxy technology to deposit a germanium semiconductor layer;
    using a low pressure chemical vapor deposition system to deposit a gate insulator layer on the germanium semiconductor layer;
    processing a annealing treatment for the gate insulator layer and the germanium semiconductor;
    mixing a carbon dioxide gas, a water and a propyl alcohol to form a supercritical fluid and carrying the supercritical fluid into the interface between the gate insulator layer and the germanium semiconductor layer in order to form an interfacial passivation layer; and
    using a thermal evaporation process to form an first aluminum film on the gate insulator layer and using the thermal evaporation process to form an second aluminum film below the germanium semiconductor layer.

6. The method according to claim 5, wherein the thickness of germanium semiconductor comprises about 2.5 μm.

7. The method according to claim 5, wherein the insulator layer is selected from the group consisting of metal oxide, silicon oxide and germanium oxide.

8. The method according to claim 6, wherein the annealing treatment comprises performed at 400° C. to 900° C.

9. The method according to claim 5, wherein the interfacial layer comprises the germanium dioxide interfacial passivation layer.

* * * * *